United States Patent [19]

Fritsche et al.

[11] Patent Number: 5,182,001
[45] Date of Patent: Jan. 26, 1993

[54] PROCESS FOR COATING SUBSTRATES BY MEANS OF A MAGNETRON CATHODE

[75] Inventors: Wolf E. Fritsche, Kleinostheim; Michael Lübbehusen, Bruchkobel; Reiner Kukla, Hanau; Siegfried BeiBwenger, Alzenau, all of Fed. Rep. of Germany

[73] Assignee: Leybold Aktiengesellschaft, Hanau, Fed. Rep. of Germany

[21] Appl. No.: 755,293

[22] Filed: Sep. 5, 1991

Related U.S. Application Data

[62] Division of Ser. No. 564,363, Aug. 8, 1990, Pat. No. 5,069,772.

[30] Foreign Application Priority Data

Jun. 13, 1990 [DE] Fed. Rep. of Germany ....... 4018914

[51] Int. Cl.$^5$ ............................................. C23C 14/34
[52] U.S. Cl. ............................. 204/192.12; 204/298.2
[58] Field of Search ........... 204/192.12, 192.1, 298.16, 204/298.17, 298.19, 298.2, 298.21, 298.22

[56] References Cited

U.S. PATENT DOCUMENTS

| | | | |
|---|---|---|---|
| 3,956,095 | 5/1976 | McLeod | 204/298.2 |
| 4,401,539 | 8/1983 | Abe et al. | 204/298.2 |
| 4,515,675 | 5/1985 | Kieser et al. | 204/298.19 |
| 4,810,346 | 3/1989 | Wolf et al. | 204/298.2 X |
| 4,865,710 | 9/1989 | Aaron et al. | 204/298.2 X |
| 5,069,772 | 12/1991 | Fritsche et al. | 204/298.2 X |

Primary Examiner—Nam X. Nguyen
Attorney, Agent, or Firm—Felfe & Lynch

[57] ABSTRACT

In a process for coating substrates by means of cathode sputtering, a magnetron cathode is used which has an annularly closed target 9. The sputter surface 9a of this target has an inner edge 9c and an outer edge 9d. The corresponding system of permanent magnets 7 has a first pole 7c which is disposed inside the inner edge and a second pole 7d disposed outside the outer edge. The characteristics of the poles geometrically resemble those of the target edges. This results in the generation of a circumferentially closed magnetic tunnel over the sputter surface. The flux lines thereof which are important to the enclosure of the plasma, are only slightly curved. In order to achieve a good material efficiency at high sputter rates and yet a high plasma density at the substrates, the spatial course of the magnetic flux lines is selectively distorted in such a way that the area of maximum target erosion, in absence of additional magnetic fields, is shifted to the vicinity of the outer edge 9d of the target 9. An averaged time value of an excitation current is applied to an additionally disposed magnetic coil 26. It serves to shift the zone of maximum target erosion approximately to the center between the two target edges. A periodic change of the average value of the excitation current shifts the zone of maximum target erosion from the center toward both sides.

1 Claim, 3 Drawing Sheets

PROCESS FOR COATING SUBSTRATES BY MEANS OF A MAGNETRON CATHODE

BACKGROUND OF THE INVENTION

The invention relates to a process for coating substrates by means of cathode sputtering including a magnetron cathode with an annularly closed target which has a sputtering surface, an inner edge and an outer edge and a magnet system including permanent magnets. The one pole thereof which is geometrically similar to the target is disposed outside the outer edge and the other geometrically similar pole thereof, which is also annularly closed, is disposed inside the inner edge. They are disposed such that at least the greater part of the magnetic flux lines is guided over the sputtering surface on only slightly arcuate paths in a manner such that an annular magnetic tunnel is formed which is closed over the sputtering surface. With respect to ground potential as well as the cathode potential, the magnet system is at a self-adjusting electrical potential.

In a classical magnetron cathode as described in the paper "The Planar Magnetron" by Jon S. Chapin, published in Research/ Development, January 1974, the pole surfaces of the magnet system are behind the target and run parallel to the sputtering surface at least in the original state of the target. Moreover, the distances between the poles are relatively small. This magnetron construction leads to highly curved magnetic field lines which emerge from the sputtering surface and after passing through the arcuate paths, they reenter the target. The consequence is a relatively small and deep erosion trench allowing only a minor exploitation of the target material since the target must be replaced in time prior to being "sputtered through."

From DE-OS 22 43 708, it is also known to even out the consumption of the target by providing cylindrical and conical coils where the axes are disposed coaxially to the axes of correspondingly formed rotationally balanced targets. The advantages of such an arrangement, however, are effective only with hollow cathodes and post-like cathodes described therein. As far as planar cathode arrangements are concerned, the high degree of curvature of the magnetic flux lines again causes the undesired, locally limited and deep erosion trenches.

Attempts were also made to enlarge the erosion trench and the efficiency of the target, the so called material efficiency; U.S. Pat. No. 3,956,093 discloses superimposing the oscillating magnetic field of an electromagnet on the static magnetic field of the permanent magnet so that the race-track-like, closed magnetic tunnel is periodically shifted on the target surface. The plasma enclosed in the magnetic tunnel follows this periodic shift thus enlarging the erosion trench. The high degree of curvature of the flux lines of the permanent magnet (the curvature corresponds to approximately the one described in the paper by Chapin), however, requires extremely high field strengths of the magnetic coil in order to produce a noticeable shift of the superimposed magnetic field. Moreover, due to the constant pole reversal of the electromagnet, the magnetic field is only shifted starting from a center position. This center position is prescribed by the course of the static magnetic flux lines of the permanent magnet. A consequence thereof is that the magnetic coil consumes a significant amount of current which in turn leads to cooling problems.

From DE-OS 27 29 286 (GB-A 1,587,566) it is also known to mechanically shift a permanent magnetic field. This however, involves a great amount of technical labor.

Hence, other attempts were also made leading to the above described process. A corresponding magnetron cathode, is known from U.S. Pat. No. 4,515,675. In this magnetron cathode, only the substantially less arcuate portion of the magnetic flux lines concentrates the plasma onto the surface of the cathode. This is achieved in that the poles of the magnetic system enclose the target cross section, i.e. the target has an annular configuration and an opening in its center where the center pole of the magnetic system is disposed. It is thus possible to achieve a uniform wear of the target without employing an additional oscillating magnetic field. However, achieving this uniformity is still not sufficient, especially when the target plates have a greater thickness, for example, more than 15 mm.

It is common to all of the above described magnetron cathodes that the plasma which causes the sputtering is more or less highly concentrated toward the direct vicinity of the target surface, the so called sputter surface. The present solutions, neither with or without the use of oscillating magnetic fields, permit an expansion of the plasma in direction of the substrates which would be desirable for certain coating processes.

On the other hand, it is also known to further expand the plasma in direction to the substrates by selectively "detuning" the known magnetron cathode and, for example, to force the flux lines emanating from the outer magnetic poles to follow a longer path, the latter extending to the substrates. A measure of this kind is described by Window and Savvides in the paper "Charged particle fluxes from planar magnetron sputtering sources," published in J. Vac. Sci. Technol. A 4 (2), March/April 1986. However, the problem of achieving a uniform wear of the target is not solved.

Such detuned magnetrons are also referred to as "unbalanced magnetrons." For further details refer to the paper by Biederman et. al. "Hard Carbon and composite metal/hard carbon films prepared by a DC unbalanced planar magnetron" (published in "Vacuum", issue 40, no. 3, 1990, pages 251 to 255).

The use of the above described and known magnetron cathodes for reactive cathode sputtering, i.e. the application of chemical compounds, where the target material (usually a metal) is only one component poses further problems: Usually, the actual sputter gas used is a noble gas, predominantly argon. A corresponding reactive gas is added to this noble gas. When oxides are produced, the reactive gas is oxygen; when nitrides are produced, it is nitrogen; when carbides are produced, it is carburetted hydrogen gas, and so on. Generally, the reaction products are electrically non-conductive and also partially form on the target surface. In the practice, this cannot be completely excluded. It is only in the area of the erosion trench that the material is sputtered faster than the reaction products can form. In the remaining surface areas, however, electrical charges can build up which finally lead to voltage arcovers followed by an instable sputtering process, not least since the controlled power supply to the sputtering cathode naturally responds to these voltage arcovers.

SUMMARY OF THE INVENTION

It is hence an object of the invention to achieve a good material efficiency and a long service life of the target, a high plasma density at the substrate and in the entire space between the target and the substrate, and still obtain a high sputter rate in the range of regular values of the a classical magnetron.

The object to be accomplished with reactive cathode sputtering processes is to avoid the harmful deposit of non-conductors on the sputter surface and hence electrical arcovers.

This object is achieved in the process described in accordance with the invention as follows a. In the area of the magnetic tunnel where the flux lines run approximately parallel to the sputtering surface, as they are present in the original state of the target, is shifted to the vicinity of the outer target edge by means of a corresponding design of the permanent magnet. In the absence of additional magnetic fields, the annular zone of maximum target erosion is shifted to the vicinity of the outer target edge;

b. An additional magnetic field which changes over time is generated outside the external pole by means of an annularly closed magnetic coil having a geometric similarity to the pole and surrounding the latter. A magnetic field is formed by means of an averaged time value of an excitation current which is at least distinct from zero. Due to the pole direction and the superimposition with the magnetic field of the permanent magnet system, this magnetic field essentially shifts the annular zone of maximum target erosion, to the center between the two target edges.

c. The zone of maximum target erosion is periodically shifted from the center position towards both sides due to a periodic change of the excitation current.

First, note that with respect to a top view on the target, the magnetic poles and the magnetic tunnel and (during operation) the plasma, the term "annular" does not only mean "circular ring-like" but also includes the geometric shape of an oval, a race track and a rectangle. The coating of large-surface substrates like, for example window panes measuring 3×4 m², requires so called rectangular cathodes where two straight and parallel running target segments have a length of approximately 3.5 m. The ends thereof are joined by target segments. Their creation can be imagined in that a circular ring-like target having an external diameter of approximately 30 cm is cut in half. These different cathode constructions are described in detail in U.S. Pat. No. 4,730,661.

Also, the statement that the magnetic poles of the respectively adjacent target edges bear a "geometrical similarity" means that the poles follow the edges of the described target configuration at the same distance. In case of greater target lengths and/or at the external edge of circular ring-like targets, closed rows of permanent magnets each having the same pole position are disposed on the circumference. Due to the fact that the opposite poles enclose the target cross section in a known way, only the one part of the magnetic field is used for the forming of the plasma which exhibits only a minor or almost straight course. Since the sputtering rate is at a maximum where the electrical and the magnetic flux lines intersect at a right angle, the flat course of the magnetic flux lines produces the following:

The electrical flux lines generally run perpendicular to the original target surface. Due to the minor curvature of the magnetic flux lines, the zone where these flux lines intersect at almost a right angle is substantially broader than in case of classical magnetrons where the flux lines show a high degree of curvature. From this, it can be understood that the so called erosion trench significantly increases in width with an increasing straight course of the magnetic flux lines over their width. Although known, this is an essential prerequisite for the process in accordance with the invention.

The flat and almost straight course of the effective magnetic flux lines is accompanied by the advantage that a shifting of the culmination points of these flux lines (with reference to the target surface) requires only substantially weaker field strengths on part of the magnetic coils. This is a significant advantage as compared to the solution according to U.S. Pat. No. 3,956,093.

Further essential features of the subject-matter can be described as follows:

First, the detuning of the permanent magnet system according to feature a) has the advantage that the properties of an "unbalanced magnetron" are imparted on the magnetron cathode. If, however, the magnetron cathode is operated without activating the magnetic coil with its particular power supply, the erosion trench would be in the vicinity of the outer target edge although it is already substantially enlarged by the flat course of the magnetic flux lines.

By means of feature b), a relatively weak magnetic field, generated by an electromagnet, shifts the zone of maximum target erosion to the center between the two target edges (with reference to a cross section of one side of the target). This means that the excitation current is always distinct from zero, however, without reaching high values which in turn would jeopardize the characteristic properties of an "unbalanced magnetron."

Feature c) essentially describes the measure of periodically changing the averaged time value of the excitation current that is distinct from zero. If necessary, this may also be to the value zero. The zone of maximum target erosion then reaches again the area where this zone would be solely due to the presence of the permanent magnet system. On the other side, an increase of the excitation current exceeding this averaged time value shifts the zone of maximum target erosion close to the inner edge of the target. It is understood that a constant change of the excitation current by the averaged value which is distinct from zero, causes a constant shift of the erosion zone.

The result is a good material efficiency and a long service life of the target and also a high sputter rate corresponding to values achieved with a classical magnetron cathode. The properties of an "unbalanced magnetron" also provide a high plasma density at the substrate and in the entire space between target and substrate and, hence, provide favorable conditions for an optimum coating process.

It must be taken into account that the individual partial tasks to be accomplished should lead to diametrically opposed solutions. Finding a way to optimally combine all requirements is the contribution of the inventors.

A reactive sputtering process has the additional advantages that a smaller flow of reactive gas, with reference to the sputter rate, is already sufficient and at the same time, the entire target surface can practically be kept completely free of insulating coatings so that undesired voltage arcovers are avoided.

It is possible to imagine the magnetic field to be segmented at each individual location in front of the cathode surface into one component parallel to the cathode surface and one perpendicular thereto. The value or the strength of these two components at a given point is a result of an additive superposition of the respective component of the permanent magnets and the electromagnetic coil. The plasma is most intense where the vertical component of the summation field disappears or assumes a very small value. Here, the so called erosion trench forms on the cathode surface. The magnetic coil causes a magnetic field to be formed which, in front of the cathode surface, predominantly consists of components perpendicular to the cathode surface. The contribution of the magnetic coil to the summation field in front of the cathode surface consists merely in the perpendicular component. The component of the summation field that is horizontal to the cathode surface essentially corresponds to the corresponding component of the permanent magnetic field. The periodic change of the excitation current of the magnetic coil causes a shift of the location on the cathode surface where the perpendicular component of the summation field in front of the cathode surface disappears or assumes a very small value from the inside to the outside and/or in the reverse direction. The erosion trench is thus shifted on the target surface. It is essential that this shift is not caused by an alternating current which is symmetrical to the O-line but that the alternating current component is superimposed on a constant direct current value. The effect of the unbalanced magnetron is here achieved mainly by the portion of direct current of the magnetic coil. The superimposed portion of alternating current does not lead to a weakening of the "unbalanced effect" as long as the current polarity does not change.

Comparative tests with conventional cathodes and a statically excited magnetic coil to generate the effect of an "unbalanced magnetron" showed that it was possible to increase the plasma density in the vicinity of the substrate. However, the plasma in the vicinity of the target surface was strongly pushed toward the cathode center, i.e. contracted. This led to a great impedance increase of the cathode, i.e. a weakening of the plasma while the cathode voltage remains the same.

Only the measure in accordance with the invention allowed designing the system of permanent magnets or "detuning" of its symmetry such that the erosion trench is located in the vicinity of the outer edge of the target without activating the magnetic coil thus leading to the success of the subject-matter of the invention. At the moment when the magnetic coil is activated and charged with a correspondingly varying excitation current, the proximity effect of the field at the target surface causes a shift of the erosion trench toward the center of the respective target cross section whereas the component of the electromagnetic field effective at a greater distance increases the plasma density in the vicinity of the substrate.

The invention further addresses a magnetron cathode for the working of the aforedescribed cathode sputtering process.

a. The system of permanent magnets is designed such that the one area of the magnetic tunnel where the flux lines are at least approximately parallel to the sputtering surface, as it is present in the original state, is shifted to the vicinity of the outer target edge. In absence of additional magnetic fields, the annular zone of maximum target erosion is located in the vicinity of the outer target edge.

b. Outside the outer pole there is disposed an annularly closed magnetic coil bearing a geometrical resemblance to the pole and surrounding the latter. This coil is connected to a control for generating an additional magnetic field with a different timing. The control is designed such that a magnetic field can be generated by at least one averaged time value of an excitation current that is distinct from zero. The direction of polarity and the superposition with the magnetic field of the permanent magnet system cause a shift of the annular zone of maximum target erosion between the two target edges. Further, the periodic change of the excitation current shifts the zone of maximum target erosion periodically from the center toward both sides.

The system of permanent magnets can be brought out of balance in various ways:

1. It is possible to select the pole distance "a" of the inner pole from the inner edge of the target to be greater than the pole distance "b" of the outer pole from the external edge of the target. The pole distances refer to parallel planes and in the original state, they traverse the poles and the target edges.
2. Alternatively, a correspondingly selection of the magnetic material permits selecting the remanence or pole field strength of the inner pole so as to be smaller than the remanence of the outer pole.
3. It is possible to configure the pole surface of the inner pole to be smaller than the pole surface of the outer pole.

These measures can be taken individually or in any desired combination or subcombination.

Particular importance is attached to the construction of the magnetic coil. It is theoretically possible to provide the necessary amount of ampere windings by means of a multiple of windings of a thin copper wire. It is, however, in this case also difficult to provide sufficient cooling since there is no cooling by convection in a vacuum, and thermal loss by radiation can be neglected due to the small permissible temperature differences. Including cooling bodies in such a coil involves a significant amount of constructional labor.

According to another embodiment of the invention, it is therefore advantageous for the magnetic coil to have 4 to 20 windings, preferably 5 to 10 windings, of a pipe made of a material of good thermal and electrical conductivity and is connected to a source of cooling agents. A high current can be applied to a coil of this kind and it can still be readily cooled.

In order to also realize this cooling system in large and/or elongated rectangular cathodes, the individual windings were advantageously interrupted in their flow (but not electrically). Individual coil segments are operated in parallel flow while the excitation current remains in series connection. Too great a flow resistance is thus avoided.

DETAILED DESCRIPTION OF THE PREFERRED EMBODIMENTS

Figure 1:
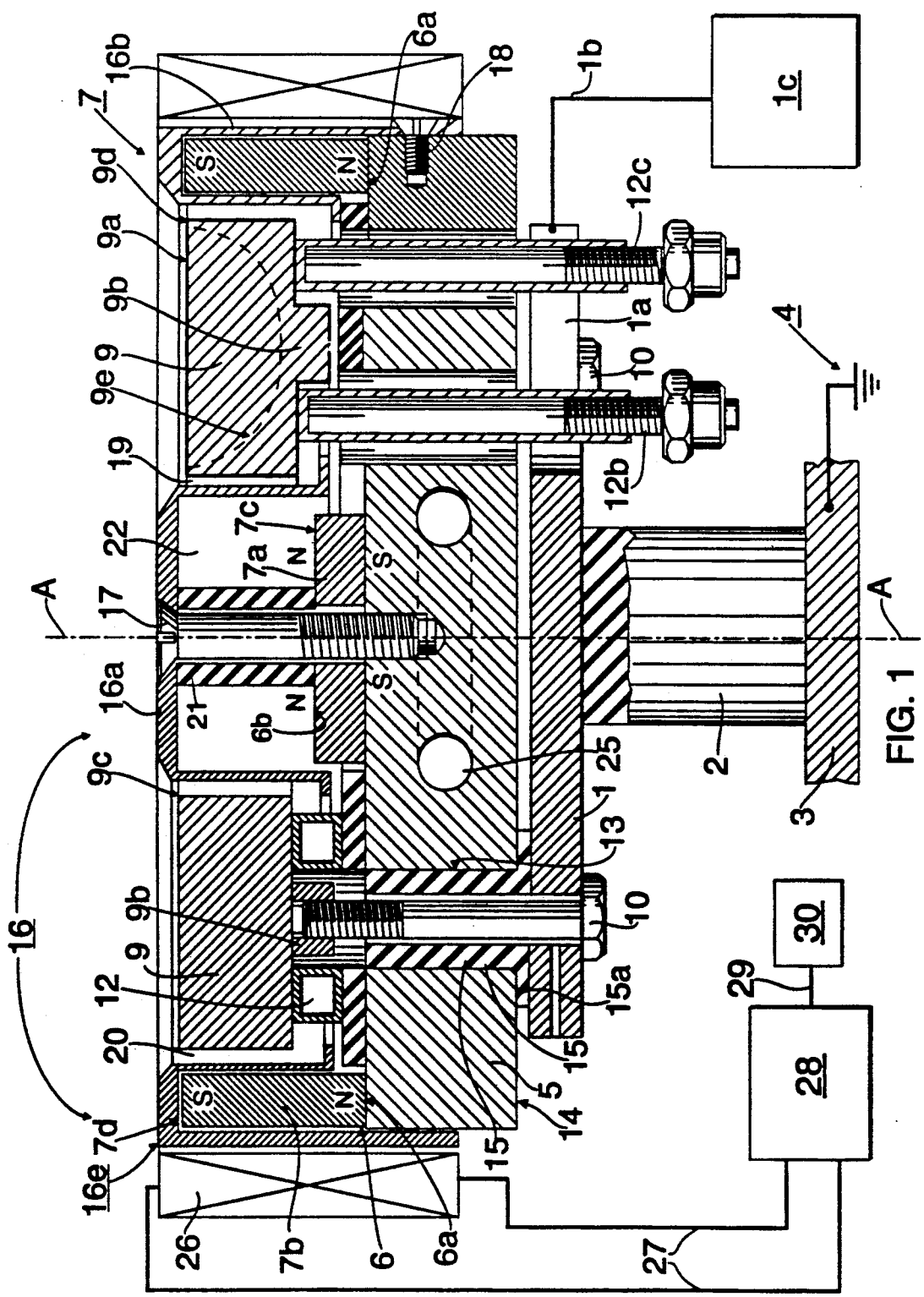
FIG. 1 is an axial section of a magnetron cathode which for the most part is rotationally balanced.

In FIG. 1, a support insulator 2 connects the power supply plate 1 to the vacuum chamber 3 which in turn is connected to ground 4. The power supply plate has radial recess 1a which will be explained in further detail hereinafter and via line 1b it is connected to a power source 1c which supplies the necessary sputtering voltage and/or cathode current.

A magnet yoke 5, insulated, is firmly connected to the power supply plate. The yoke is also essentially plate-like. On its top side, the magnet yoke has a planar surface 6 in which there are located annularly closed support surfaces 6a and 6b for the system 7 of permanent magnets. The permanent magnet system 7a includes an inner annular magnet 7a and a closed outer row of bar magnets 7b all of which are axially magnetized with respect to the axis A—A of the system. They are magnetized such that the direction of polarity of the inner annular magnet 7a is reversed to the one of the outer bar magnet 7b. This pole position is expressly included in FIG. 1. On the side facing away from the magnet yoke 5, the permanent magnet system 7 has poles 7c and 7d formed by pole surfaces. These poles are located on different planes. With respect to the front side of the magnetron cathode, the one plane across the pole 7c is set back much further than the plane across pole 7d. The effects of this measure will be explained in greater detail with reference to FIG. 2.

Between the support surfaces 6a and 6b between the poles 7c and 7d, there is an annularly closed support surface 8. Above it, there is an annular insulating body 11 and an annular target 9 with a sputtering surface 9a. By correspondingly selecting the thickness of the insulating body 11, it is possible to arrange the sputter surface 9a in direction of depth of the cathode in a certain spatial position to the poles 7c and 7d. On its rear side, the target 9 is provided with a circumferential rib 9b in which there are several circumferentially distributed tapped holes for take-up screws 10. These take-up screws allow the target to be braced with respect to the magnet yoke 5 and the power supply plate. The take-up screws 10 also serve the purpose of transmitting the cathode current.

Between the target 9 and the insulating body 11, there is a target cooling system 12. The latter is a correspondingly wound pipe of a rectangular cross section. Spaced apart at sufficient insulating distances, the two ends 12b and 12c pass through boreholes in the magnet yoke 5 and through the radial recess 1a in the power supply plate When the take-up screws 10 are tightened, the target 9 gets to rest on the target cooling system which in turn gets to rest on the insulating body 11.

As can be seen from FIG. 1, a borehole 13 extends from the planar surface 6 to the opposite planar surface 14 of the magnet yoke 5. The borehole of FIG. 1 is representative of a multiple of such boreholes through which a take-up screw 10 is passed.

A sleeve-like insulating body 15 is disposed in the boreholes 13. Outside thereof, this body has a collar 15a resting on the planar surface. Due to the force of the take-up screws 10, the power supply plate is supported on this collar.

It can be understood that the power supply plate 1 with the target 9 is insulated with respect to the magnetic yoke 5 including the magnet arrangement 7 and with respect to vacuum chamber 3 and ground 4. Whereas the target 9, via the power supply plate 1, can be brought to a defined negative potential and ground 4 is also a defined potential (zero-potential), the magnet system 7 with the magnetic yoke 5 is electrically independent and the operational conditions permit the adjustment thereof to a prescribed intermediate potential so that there is no sputtering of the magnet system. Such a potential is also referred to as a "floating potential". A cooling channel 25 in the magnet yoke 5 serves to sink heat.

The magnet system 7 is accommodated in a housing 16 which is made of a ferromagnetic material. The housing 16 includes two rotationally balanced parts. One is a pot-like central housing part 16a which encloses the annular magnet 7a and is braced with respect to the magnet yoke by means of a screw 17 and the other is an annular housing part 16b which, in a cross sectional view, encloses the bar magnets 7b in an endless, i.e. closed row and is also attached to the magnet yoke 5 by means of several screws 18 of which only one is represented. The housing has a front face 16e which includes an annular surface (of the housing part 16a) and a circular disk-like surface 9 (of the housing part 16b) concentric thereto. Looked at from this front face, the housing 16 is configured so as to be drawn behind the target 9.

It can furthermore be seen from FIG. 1 that both parts 16a and 16b of the housing, beginning at the front face 16e, overlap the magnets 7a and 7b and the poles 7c and 7d thereof. In the form of two cylindrical frames, these parts cover the cylindrical inner side and the cylindrical outer side of the target 9 while maintaining the two hollow cylindrical air gaps 19 and 20.

Whereas the pole 7d almost contacts the rear side of the front face 16e of the housing, a chamber 22 is formed between pole 7c and the rear of the front side 16e of the housing. A screw 17 which is surrounded by a cover 21 of insulating material passes through this chamber. The remaining volume can also be filled with filler pieces made of non-ferromagnetic material.

Finally, the following can also be seen in FIG. 1:

The target has an inner edge 9c and an outer edge 9d enclosing the sputter surface therebetween. When the target is new, the sputter surface has a planar configuration. With increasing consumption of the target material, however, it is shifted in direction toward the broken line 9e. The so consumed part of the target 9 is also referred to as the "erosion trench."

Pole 7c is located within the inner edge 9c and pole 7d is located outside the outer edge 9d so that the poles 7c and 7d and the target 9 do not intersect in the projection on the support surface 8, particularly since the air gaps 19 and 20 and the frames of the housing 16 are interposed.

The outer cylindrical surface of the housing 16 is surrounded by a magnetic coil 26 which will be explained in greater detail with reference to FIG. 3. In the present case, this magnetic coil is cylindrical coil which surrounds the magnetron cathode over an essential portion of its axial extension. A line 27 connects the magnetic coil 26 to a power source 28 to which a control 30 is connected via a line 29. This control 30 generates various output voltages which will be explained in further detail with reference to FIG. 4. The individual voltage characteristics can be selected.

The control 30 is designed such that a magnetic field is generated by an average time value of an excitation current which is distinct from zero and by means of the magnetic coil 26. This magnetic field shifts the annular zone of maximum target erosion to the center between the two target edges 9c and 9d. Moreover, due to the periodic change of the excitation current according to FIG. 4, the zone of maximum target erosion is periodically shifted from the center position toward both sides.

The retention time of this shift and its speed can be experimentally determined.

Figure 2:
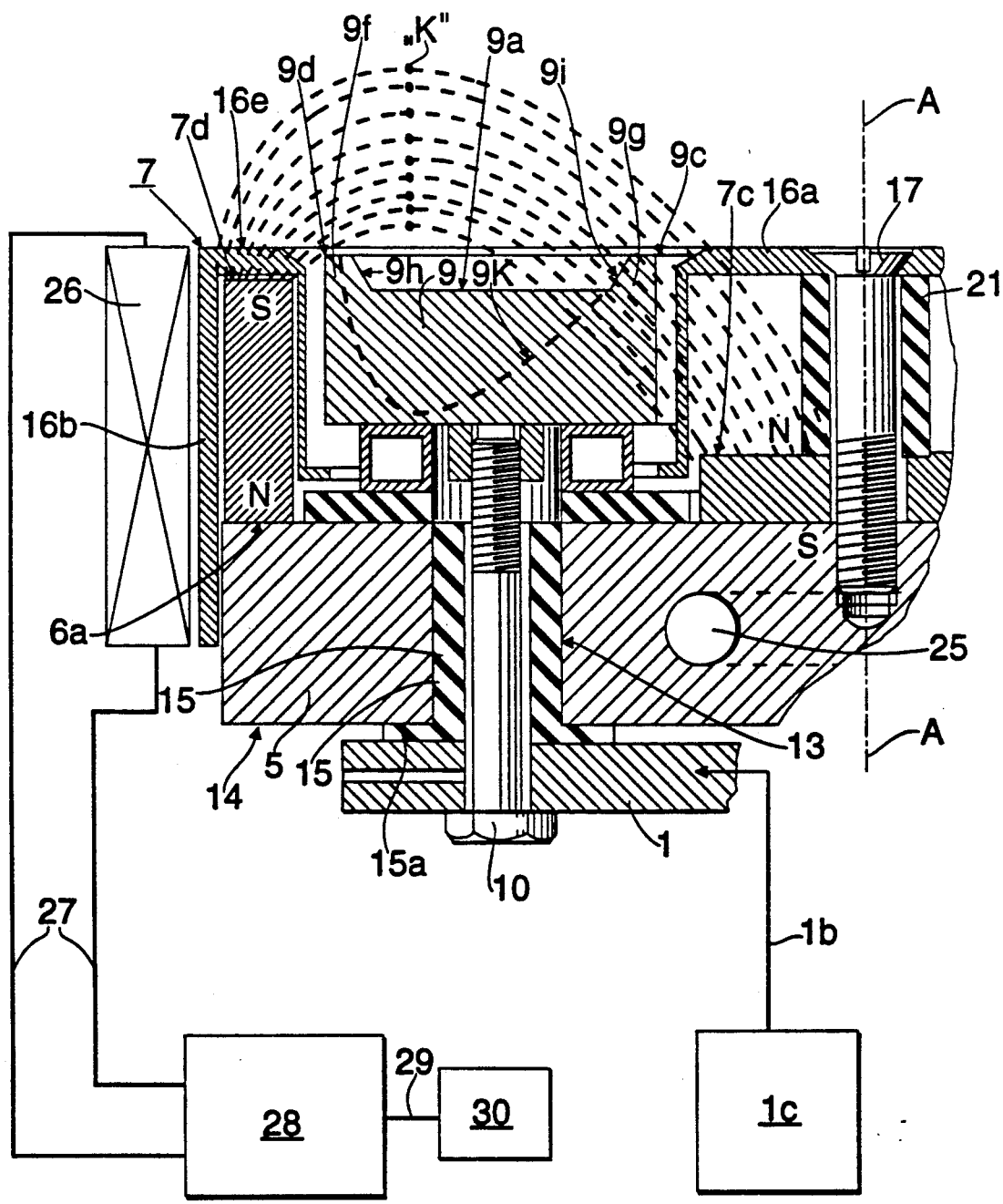
FIG. 2 is an enlarged representation of a segment of FIG. 1, however, representing a target of a different configuration.

In FIGS. 1 and 2, same parts bear the same reference numerals. The sputter surface 9a, however, is in this case on both sides (in a cross sectional view) surrounded by annular enlargements 9f and 9g. Toward the sputter surface 9a, the annular enlargements are provided with the inclined planes of a slope 9h and 9i. The angle of slope has the advantage that no material is deposited at the inner edge of the annular enlargements which could come off after a while to contaminate the substrate and/or the target.

FIG. 2 also shows the curves of the magnetic flux lines which extend between the poles 7c and 7d. It can be seen that, since the pole surfaces are offset in depth toward the left, the culmination points "K" of the flux lines were shifted to the left, i.e. in direction toward the outer edge 9d. As long as the magnetic coil 26 is not passed through by the excitation current, the maximum intensity of the plasma is generated below the culmination so that an erosion trench, the cross section of which is indicated by the broken line 9k, would also be formed at this point. When the magnetic coil 26 is now added with a corresponding variation of the excitation current according to FIG. 4, the erosion trench is given a curve according to line 9e in FIG. 1.

Figure 3:
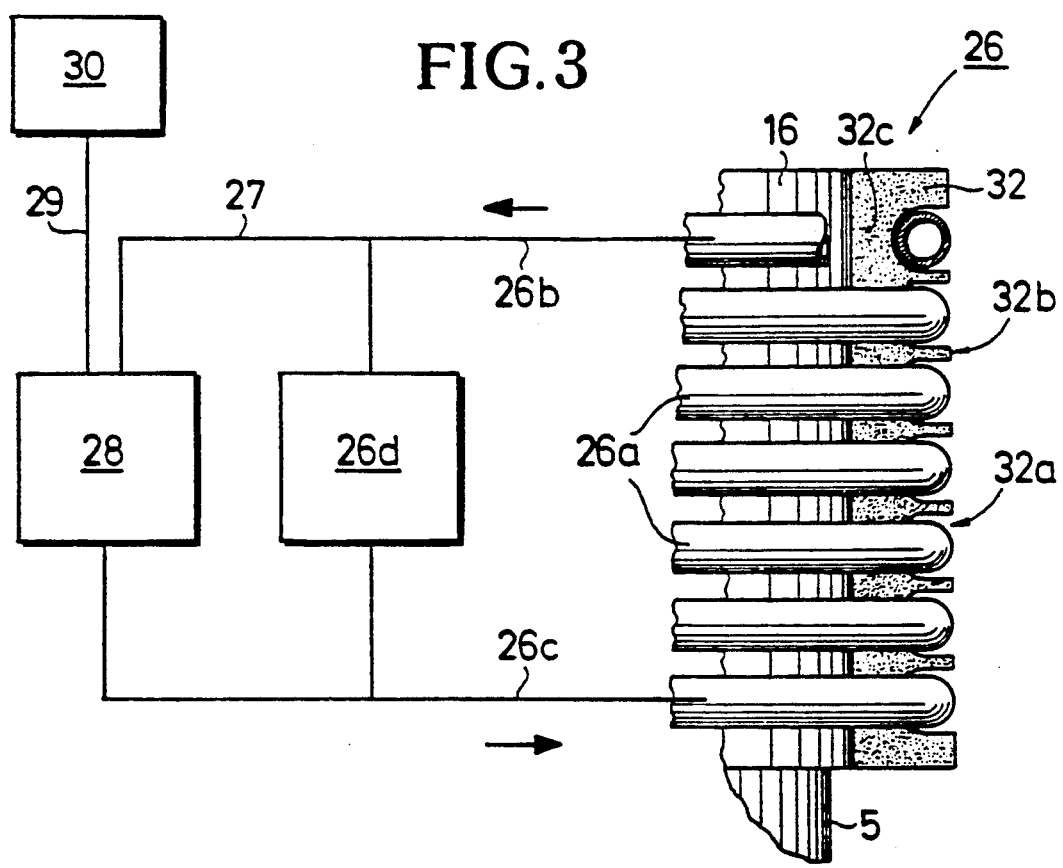
FIG. 3 is segment of the magnetron cathode including the magnetic coil in side view and FIG. 4 is a diagram representing different curves of the excitation currents for the magnetic coil.

FIG. 3 shows the details of the magnetic coil 26 which includes a total of seven windings 26a of a copper pipe which is wound about the housing 16. In order to maintain corresponding insulating distances, spaced apart insulators 32 are mounted on the housing 16. Only one of these insulators is shown in FIG. 3. The insulator has the shape of block where the longitudinal side is provided with notches 32a which correspond to the diameter of the pipe. The spacers 32b and 32c disposed therebetween ensure that there is a sufficient insulating distance. The cooling lines 26b and 26c connect the ends of the pipes to a cooling source 26d. The latter, in its simplest form, can be a heat exchanger.

Figure 4:
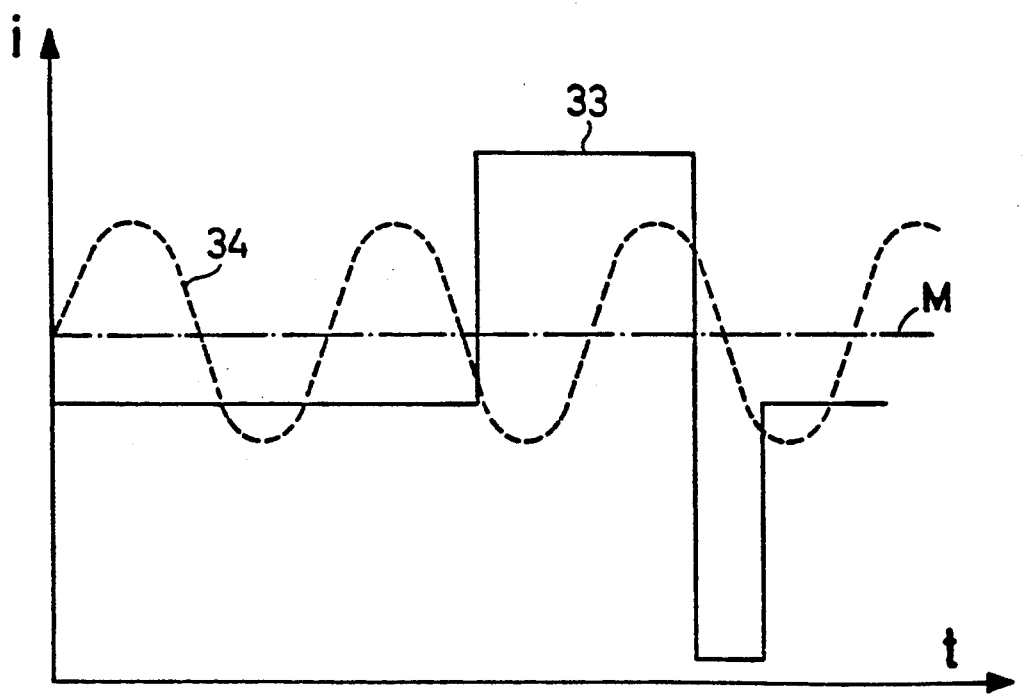

In the diagram of FIG. 4, time t is outlined on the abscissa and the excitation current i on the ordinate, each in non-dimensional units. Curve 33 represents a current which has an average time value M distinct from zero. If this average value is maintained, the zone of maximum target erosion would be created almost exactly in the center between the target edges 9c and 9d, i.e. if the excitation current were varied. Any up or down variation, however, shifts the zone of maximum target erosion from the center toward both sides. The result is an erosion trench as represented by the broken line 9e of FIG. 1. As already mentioned, the time proportions for positive or negative deviations from the average value M can be experimentally determined. Under certain conditions, very short retention times of the plasma at each end of the lifting may already be sufficient to sputter off reaction products formed on the sputter surface.

Curve 34 indicated in a broken line shows another possibility of varying the excitation current: In this case, the excitation current follows a sinusoidal curve, however, not around the zero-line (as in prior art) but around this average value M.

The substrate is not shown in the Figures: It is located opposite the sputter surface 9a at a few centimeters' distance. In case there is one or several substrates with planar coating surfaces, the latter and/or their transport path are parallel to the sputter surface.

As opposed to FIG. 1, it is also possible to assembly and operate the magnetron cathode in overhead position.

I claim:

1. Method for coating substrates by cathode sputtering an annularly closed target having a sputtering surface with an inner edge and an outer edge, comprising
   providing a permanent magnet system having an annularly closed outer pole outside said outer edge and an annularly closed inner pole inside said inner edge, said poles being arranged to provide a closed annular tunnel of magnetic flux lines over said sputtering surface, which flux lines are parallel to said sputtering surface over an area which is closer to said outer edge than said inner edge, and
   superimposing an additional magnetic field with the magnetic field of the permanent magnets by means of an annularly closed magnetic coil outside said outer pole, said additional field being varied periodically with time by an excitation current with an averaged time value greater than zero in order to periodically shift the plane of parallel flux lines toward the inner edge of said target.

* * * * *